United States Patent [19]
Chiozzi

[11] Patent Number: 6,060,940
[45] Date of Patent: May 9, 2000

[54] CMOS OUTPUT STAGE FOR PROVIDING STABLE QUIESCENT CURRENT

[75] Inventor: Giorgio Chiozzi, Cinisello Balsamo, Italy

[73] Assignee: SGS-Thomson Microelectronics S.r.l., Agrate Brianza, Italy

[21] Appl. No.: 09/059,973

[22] Filed: Apr. 14, 1998

[30] Foreign Application Priority Data

Apr. 28, 1997 [IT] Italy .................................. MI97A0985

[51] Int. Cl.[7] ............................................... H03K 17/687
[52] U.S. Cl. .......................... 327/437; 327/543; 327/562; 330/264; 330/267
[58] Field of Search ..................................... 327/391, 437, 327/530, 538, 543, 562, 563, 561; 330/264, 267

[56] References Cited

U.S. PATENT DOCUMENTS

| | | | |
|---|---|---|---|
| 4,570,128 | 2/1986 | Monticelli | 330/267 |
| 4,868,518 | 9/1989 | Blanken et al. | 330/267 |
| 5,148,120 | 9/1992 | Kano et al. | 330/267 |
| 5,475,339 | 12/1995 | Maida | 327/561 |
| 5,491,437 | 2/1996 | Rincon et al. | 327/108 |
| 5,521,553 | 5/1996 | Butler | 330/267 |
| 5,670,910 | 9/1997 | Kato | 330/253 |
| 5,786,731 | 7/1998 | Bales | 330/267 |
| 5,818,295 | 10/1998 | Chimura et al. | 327/561 |
| 5,856,749 | 1/1999 | Wu | 327/66 |
| 5,909,146 | 6/1999 | Okada | 330/255 |

*Primary Examiner*—Timothy P. Callahan
*Assistant Examiner*—Terry L. Englund
*Attorney, Agent, or Firm*—Wolf, Greenfield & Sacks, P.C.; James H. Morris; Theodore E. Galanthay

[57] ABSTRACT

A CMOS output stage for providing stable quiescent current. The output stage includes a circuit that relates the quiescent current to the channel geometry of a power NMOS transistor and of an NMOS reference transistor of a reference current source. This configuration removes the dependency of the quiescent current on a power PMOS transistor used in the CMOS output stage, the threshold voltage of which may drift over time under high current and voltage operation, and adversely affects quiescent current stability.

15 Claims, 2 Drawing Sheets

CMOS OUTPUT STAGE FOR PROVIDING STABLE QUIESCENT CURRENT

BACKGROUND OF THE INVENTION

1. Field of the Invention

The present invention relates to a CMOS output stage, particularly adapted for use in analog circuits, audio devices, and for general application to any kind of operational amplifier.

2. Discussion of the Related Art

Analog circuits using MOS transistors suffer a drawback related to P-channel MOS transistors, whose threshold voltage drifts over time (changes value). This drift effect is caused by hot electrons trapped in the gate oxide and is particularly evident for transistors operating at high current densities and high voltages, such as power transistors used in operational amplifiers.

CMOS output stages are known wherein a MOS transistor in a diode configuration is employed as a reference for the gate voltage to be applied to the power MOS transistor when quiescent (i.e., when there is no output signal). The reference does not drift, because the current density flowing through the MOS transistor and the voltage across it are both low. However, the threshold of the power MOS transistor, which has to withstand intense currents and high voltages, drifts and thus causes undesirable variations in the quiescent current.

FIG. 1, which illustrates a conventional CMOS output stage, shows that a diode-connected MOS transistor and a reference current source are used for each power MOS transistor in order to set its quiescent current.

In particular, for the P-channel power MOS transistor 10, a diode-connected P-channel reference MOS transistor 12 is provided with a corresponding reference current source 14, and a differential stage 16 including two P-channel MOS transistors and two N-channel MOS transistors. Likewise, circuit elements that are mirror-symmetrical to those described above namely reference N-channel MOS transistor 20 and reference current source 22, are used for the N-channel power MOS transistor 18.

In the quiescent state, the voltage across the gate and source of the reference transistor 12 is reproduced across the gate and source of the power transistor 10 (the same occurs for reference transistor 20 and the power transistor 18). Therefore, in the quiescent state the current delivered by the power transistor is equal to the ratio of the channel geometries of the power transistor and of the reference transistor, multiplied by the value of the reference current set by the reference current source; assuming their threshold voltages are equal, the reference transistor and the power transistor are in a current mirror configuration.

The total quiescent current is the sum of the quiescent current conducted by the drain terminal of the P-channel power transistor 10 and of the current conducted by the N-channel power transistor 18 (which is not affected by threshold drift).

The above-described output stage suffers a first drawback: the quiescent current depends on the threshold voltage of the P-channel power transistor 10, which tends to vary over time (tends to decrease), whereas the threshold voltage of the P-type reference transistor 12 remains substantially constant over time. This decrease in the threshold voltage of the power transistor 10 results in an increase in the current delivered for the same gate voltage, which is unacceptable for some applications.

Further drawbacks include a considerable circuit area and a complicated circuit structure.

SUMMARY OF THE INVENTION

An object of the present invention is therefore to provide a CMOS output stage that is free from threshold drift of the P-channel power transistor of the stage and is accordingly capable of keeping the quiescent current stable.

Another object of the present invention is to provide a CMOS output stage having a smaller area occupation than conventional solutions.

Another object of the present invention is to provide a CMOS output stage that does not have a feedback loop.

Another object of the present invention is to provide a CMOS output stage that, when used in audio amplifiers, is capable of eliminating the noise that is normally generated when an amplifier is switched on.

Another object of the present invention is to provide a CMOS output stage that can be used as a gain and output stage of operational amplifiers.

Another object of the present invention is to provide a CMOS output stage having a wide frequency response.

Another object of the present invention is to provide a CMOS output stage that is highly reliable, relatively easy to manufacture and inexpensive.

According to the present invention, these and other objects are achieved by a CMOS output stage, comprising a complimentary transistor pair including a first MOS power transistor and a second MOS power transistor each having a drain terminal. The pair is connected between a power supply line and a ground, and an output of the stage is formed at the drain terminals of the first and second transistors. The output stage also includes a circuit for setting a quiescent current of the output stage including a reference current source connected to a current mirror and to a gate terminal of the first power MOS transistor, and an additional MOS transistor that is connected between the current mirror and the ground with a resistor interposed. The quiescent current is set by a channel geometry ratio of the second power MOS transistor and of a transistor included in the reference current source, multiplied by the reference current of the reference current source, the second power transistor being of the N-channel type.

BRIEF DESCRIPTION OF THE DRAWINGS

Further characteristics and advantages of the present invention will become apparent hereinafter from the following detailed description of a preferred but not exclusive embodiment of the CMOS output stage according to the invention, illustrated by way of non-limiting example in the accompanying drawings, wherein.

DETAILED DESCRIPTION

Figure 1:
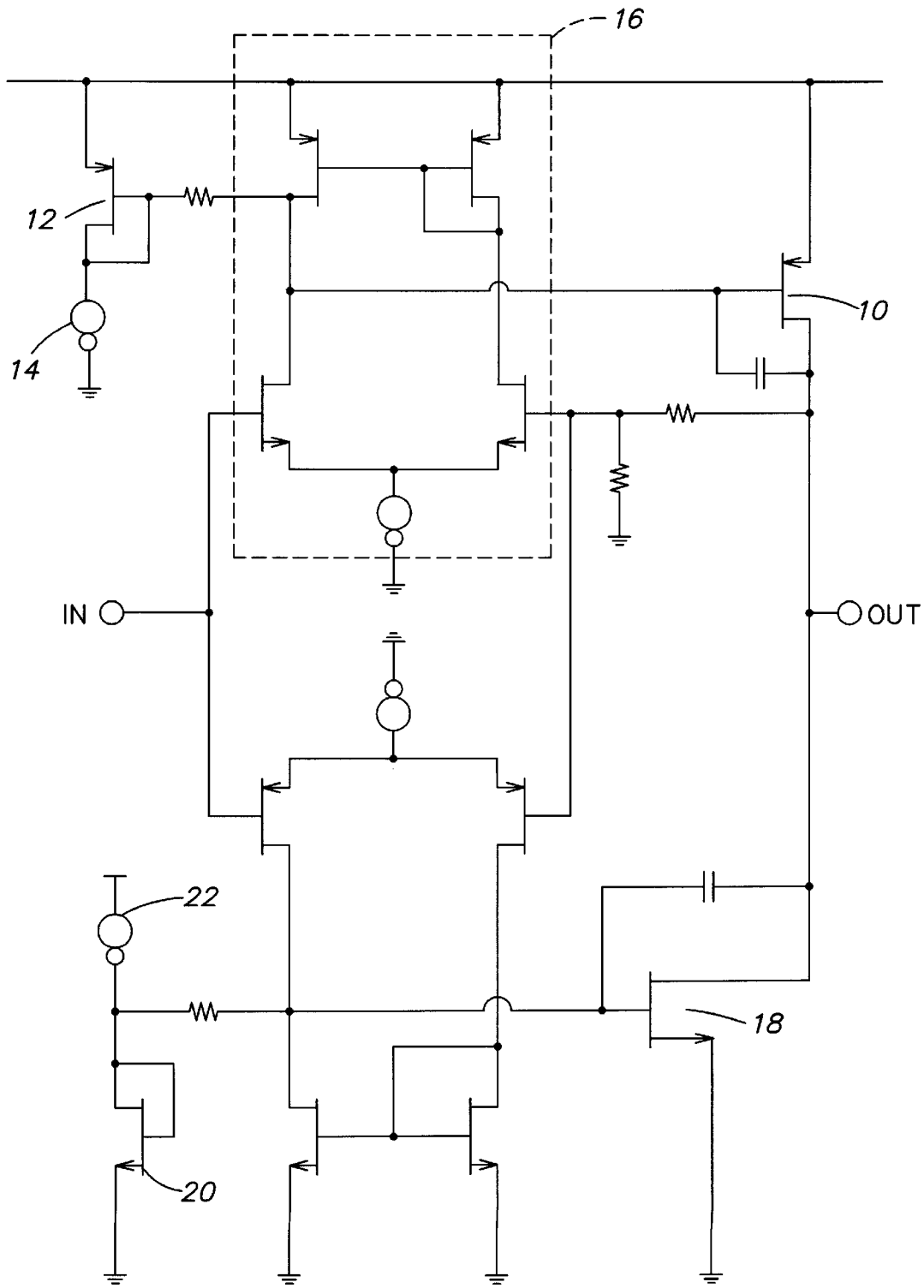
FIG. 1 circuit diagram of a conventional CMOS output stage.
Figure 2:
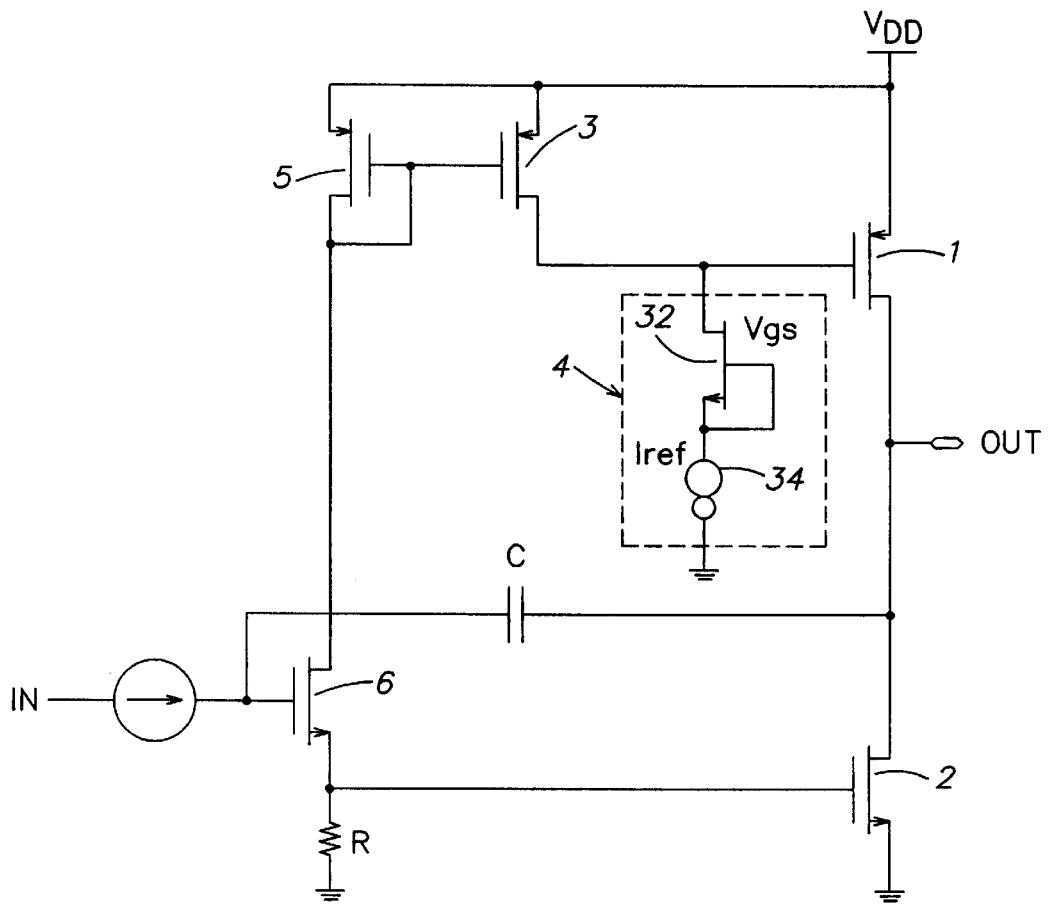
FIG. 2 is a circuit diagram of a CMOS output stage according to the present invention.

With reference to FIG. 2, a CMOS output stage according to a preferred embodiment of the present invention comprises a first P-channel power transistor 1 and a second N-channel power transistor 2 that are connected in a CMOS configuration.

In the first transistor 1, the source terminal is connected to the supply voltage $V_{DD}$ and the drain terminal is connected to the drain terminal of the second transistor 2. The source terminal of the second transistor 2 is connected to the ground. The output of the stage, designated by OUT, is acquired at the drain terminals of the two transistors 1 and 2.

The gate terminal of the first transistor 1 is connected to the drain terminal of a third P-channel MOS transistor 3, the source terminal of which is connected to the supply voltage $V_{DD}$. The drain terminal of the third transistor 3 is connected to a reference source 4 which is in turn connected to the ground.

In a diode-connected P-channel reference MOS transistor 5, the gate terminal is connected to the gate terminal of the MOS transistor 3, the source terminal is connected to the supply voltage $V_{DD}$, and the drain terminal is connected to the drain terminal of an additional N-channel MOS transistor 6. The gate terminal of transistor 6 serves as an input to the CMOS output stage, and may be connected, for example, to the input stage of an operational amplifier (not shown). The source terminal of transistor 6 is connected to the ground by an interposed resistor R. The MOS transistors 5 and 6 are therefore connected to each other in a CMOS configuration.

The gate terminal of the transistor 2 is connected to the source terminal of the transistor 6. A compensating capacitor C is interposed between the gate terminal of the transistor 6 and the drain terminals of the MOS transistors 1 and 2.

With reference to FIG. 2, the operation of the CMOS output stage according to the present invention is as follows.

In the quiescent state, i.e., in the absence of an output signal, the current of the reference source 4 is equal to the current delivered by the drain terminal of the transistor 3. Transistors 3 and 5 form a current mirror and are assumed to be identical; thus, the current that flows through the transistor 5 is equal to the drain current of transistor 3.

Accordingly, when appropriately biased, the same current Iref (i.e. Vgs/R) also flows through transistor 6 and through the resistor R. As a result, a voltage that is equal to the reference voltage Vgs appears across the gate and source of power transistor 2.

The reference source 4 includes an N-channel MOS reference transistor 38 that has a gate-source voltage Vgs when biased by a reference current Iref 34. Accordingly, when the gate voltage of the power transistor 2 is equal to Vgs, the power transistor 2 mirrors the reference transistor 32 that is included in the reference source 4, assuming that their threshold voltages are substantially the same.

The quiescent current is therefore set by means of the channel geometry ratio of N-channel transistors; it is determined by the channel geometry ratio of the power transistor 2 and of the reference transistor 32, multiplied by the reference current Iref 34 that biases the reference transistor 32. In this manner, the quiescent current is related to the N-channel MOS power transistor 2, and the threshold voltage of the P-channel power transistor 1 does not appear in the expression of the quiescent current. Therefore, the quiescent current is not influenced by any drift of the P-channel transistor threshold voltage.

Considering transient-mode operation, and assuming that the transistor 1 is to more heavily conduct current, i.e., that a positive half-wave occurs (low signal input to the transistor 6), the gate voltage of the transistor 6 decreases and therefore the current through this transistor decreases.

Accordingly, the current conducted by the MOS transistors 3 and 5 decreases and in particular the current conducted by the transistor 3 is lower than the current conducted by the reference source 4. Therefore, the voltage of the gate terminal of the transistor 1 decreases and the current conducted by it increases.

By decreasing the gate voltage of the transistor 6 as mentioned, the voltage of its source terminal also decreases. As a result, the gate source voltage of the power transistor 2 decreases, as does the current it conducts to ground.

When instead the transistor 2 is to more heavily conduct current, i.e., when a negative half-wave occurs, the gate voltage of the transistor 6 increases, more current flows through transistor 6, and its source voltage increases accordingly. As a result, the gate voltage of the transistor 2 also increases and the transistor thus conducts a higher current.

At the same time, since the current flowing through the transistor 6 increases, the current conducted by the transistors 5 and 3 also increases. The transistor 3 therefore conducts a higher current than that of the reference source 4. As a result, the gate voltage of the power transistor 1 increases, and the transistor 1 conducts less or, in the extreme, switches off.

Figure 3:
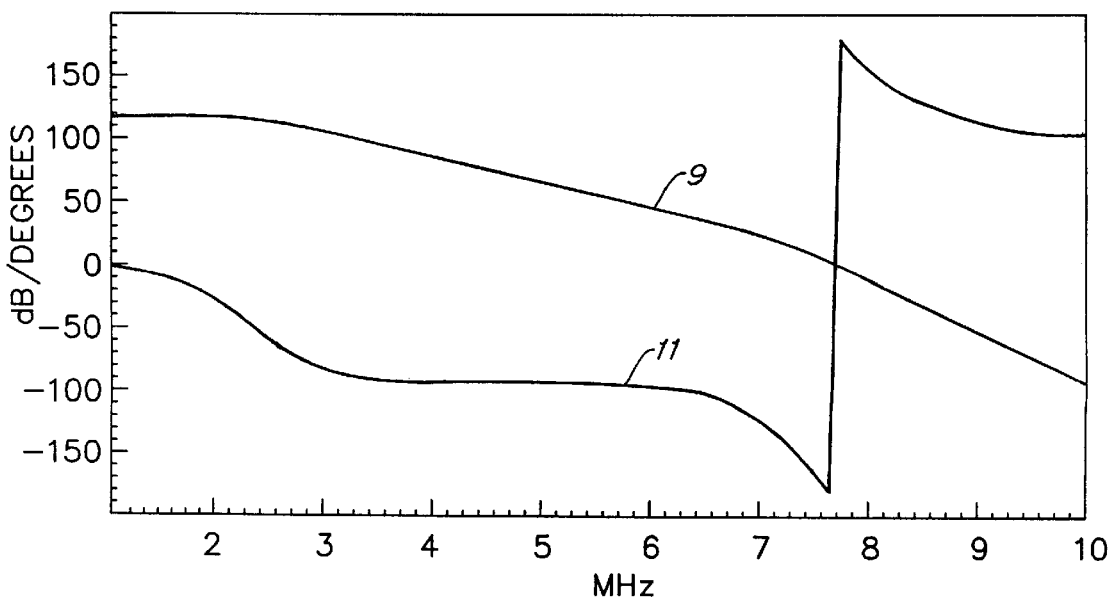
FIG. 3 is a Bode diagram of the open-loop gain of an operational amplifier whose gain stage and output stage include the circuit shown in FIG. 2.

The chart shown in FIG. 3 plots the open-loop Bode diagram of an operational amplifier in which the gain and output stage is provided according to the preferred embodiment of the present invention.

The curve of the chart designated by the reference numeral 9 represents the amplitude, while the curve designated by the reference numeral 11 represents the phase. FIG. 3 shows that the frequency response has a wide band that reaches up to approximately 10 MHz.

In practice, it has been observed that the CMOS output stage according to the present invention fully achieves the intended objects, since it eliminates the threshold drift of the power transistors of the stage, thereby eliminating quiescent current variations. Additionally, the small number of circuit components of the solution according to the present invention allows a reduction of the physical area occupied by the CMOS output stage.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only, and it is not intended as limiting. The invention's limit is defined only in the following claims and the equivalent thereto.

What is claimed is:

1. A CMOS output stage, comprising:
   a complementary transistor pair including a first MOS power transistor and a second MOS power transistor each having a drain terminal, the pair connected between a power supply line and a ground, an output of the stage being formed at the drain terminals of the first and second transistors;
   a circuit connected to a gate terminal of the first MOS power transistor for setting a quiescent current of the output stage, the circuit including:
      a reference source having a reference current and including a reference transistor; and
      a current mirror;
   an additional MOS transistor connected to the current mirror; and
   a resistor connected between the additional MOS transistor and the ground, wherein the quiescent current is set by a channel geometry ratio of the second MOS power transistor and the reference transistor multiplied by the reference current, the second MOS power transistor being of the N-channel type.

2. A CMOS output stage according to claim 1, wherein the reference current is equal to a gate-source voltage of the reference transistor divided by the value of the resistor.

3. A CMOS output stage according to claim 1, wherein the current mirror includes:
   a first P-channel MOS transistor connected between the power supply line and the reference source, the reference source being connected to the ground; and
   a second P-channel MOS transistor coupled to the first P-channel MOS transistor.

4. A CMOS output stage according to claim 3, wherein the second P-channel MOS transistor is diode-connected between the power supply line and the additional MOS transistor, a gate terminal of the second P-channel MOS transistor being connected to a gate terminal of the first P-channel MOS transistor.

5. A CMOS output stage according to claim 1, wherein:
   the additional MOS transistor is of the N-channel type; and
   a gate terminal of the additional MOS transistor receives an input signal to the CMOS output stage.

6. A CMOS output stage according to claim 1, wherein a gate terminal of the second MOS power transistor is connected to a source terminal of the additional MOS transistor.

7. A CMOS output stage according to claim 1, further comprising a compensating capacitor interposed between the drain terminals of the first and second MOS power transistors and the gate terminal of the additional MOS transistor.

8. An operational amplifier including the CMOS output stage according to claim 1.

9. A CMOS output stage comprising:
   a complimentary pair of transistors including first and second transistors;
   a reference source coupled to a gate terminal of the second transistor; and
   a mirror circuit, coupled to the gate terminal of the second transistor, to set a quiescent current in the complimentary pair based on the first transistor and the reference source, the mirror circuit including:
   a current mirror having a reference input and an output connected to the gate terminal of the second transistor;
   an auxiliary transistor to receive an input signal to the CMOS output stage, the auxiliary transistor connected to the reference input of the current mirror and to a gate terminal of the first transistor; and
   a sampling element connected to the auxiliary transistor and to the gate terminal of the first transistor.

10. The output stage of claim 9, wherein the first transistor is an NMOS transistor.

11. The output stage of claim 10, wherein the reference source includes:
    a reference transistor; and
    a reference current coupled to the reference transistor.

12. The output stage of claim 11, wherein the mirror circuit sets the quiescent current based on a channel geometry ratio of the first transistor and the reference transistor, and the reference current.

13. The output stage of claim 10, wherein:
    the reference source has a value proportional to the sampling element.

14. A method for providing a stable quiescent current in a CMOS output stage, comprising steps of:
    providing a reference current derived from a gate-source voltage of a reference transistor and a value of a sampling element, the reference transistor having a threshold voltage equal to that of a first transistor of a pair of complimentary output transistors;
    reproducing the reference current in the sampling element to generate the gate-source voltage; and
    applying the gate-source voltage to the first transistor to provide the quiescent current.

15. The method of claim 14, wherein the step of reproducing the reference current includes steps of:
    making a copy of the reference current; and
    passing the copy to the sampling element.

* * * * *

UNITED STATES PATENT AND TRADEMARK OFFICE
CERTIFICATE OF CORRECTION

PATENT : 6,060,940
DATED : May 9, 2000
INVENTOR(S) : Giorgio Chiozzi

It is certified that error appears in the above-identified patent and that said Letters Patent is hereby corrected as shown below:

Column 3, line 44 should read as follows:

reference transistor 32 that has a gate-source voltage Vgs

Signed and Sealed this

Twentieth Day of March, 2001

*Attest:*

NICHOLAS P. GODICI

*Attesting Officer*  *Acting Director of the United States Patent and Trademark Office*

UNITED STATES PATENT AND TRADEMARK OFFICE
CERTIFICATE OF CORRECTION

PATENT NO. : 6,060,940
DATED : May 9, 2000
INVENTOR(S) : Giorgio Chiozzi

It is certified that error appears in the above-identified patent and that said Letters Patent is hereby corrected as shown below:

Column 3,
Line 44, should read as follows: reference transistor 32 that has a gate-source voltage Vgs Signed and Sealed this Second Day of October, 2001

Attest:

*Nicholas P. Godici*

NICHOLAS P. GODICI
*Acting Director of the United States Patent and Trademark Office*

*Attesting Officer*